United States Patent [19]
Tran et al.

[11] Patent Number: 6,046,106
[45] Date of Patent: Apr. 4, 2000

[54] HIGH DENSITY PLASMA OXIDE GAP FILLED PATTERNED METAL LAYERS WITH IMPROVED ELECTROMIGRATION RESISTANCE

[75] Inventors: Khanh Q. Tran, San Jose; Paul R. Besser, Cupertino; Guarionex Morales, Santa Clara; Shekhar Pramanick, Fremont, all of Calif.

[73] Assignee: Advanced Micro Devices, Inc., Sunnyvale, Calif.

[21] Appl. No.: 08/924,133

[22] Filed: Sep. 5, 1997

[51] Int. Cl.[7] .................................................. H01L 21/44
[52] U.S. Cl. ........................... 438/660; 438/688; 438/622
[58] Field of Search .................................... 438/660, 688, 438/622

[56] References Cited

U.S. PATENT DOCUMENTS

| | | |
|---|---|---|
| 4,352,239 | 10/1982 | Pierce . |
| 4,406,709 | 9/1983 | Celler et al. ........................... 148/1.5 |
| 5,001,541 | 3/1991 | Virkus et al. ........................... 357/68 |
| 5,300,307 | 4/1994 | Frear et al. . |
| 5,679,606 | 10/1997 | Wang et al. ........................... 437/195 |
| 5,716,890 | 2/1998 | Yao ........................................ 438/624 |
| 5,814,564 | 9/1998 | Yao et al. ............................... 438/723 |

OTHER PUBLICATIONS

S. Bothra et al., "Integration of 0.25μm Three and Five Level Interconnect System for High Performance ASIC", Proceedings of VMIC Conference, 1997 ISMIC, Jun. 1997, pp. 43–48.

*Primary Examiner*—John F. Niebling
*Assistant Examiner*—David A. Zarneke

[57] ABSTRACT

Borderless submicron vias are formed between patterned metal layers gap filled with a high density plasma oxide. Heat treatment is conducted after chemical vapor deposition of the high density plasma oxide to substantially increase the grain size of the patterned metal layers, thereby improving electromigration resistance.

25 Claims, 3 Drawing Sheets

HIGH DENSITY PLASMA OXIDE GAP FILLED PATTERNED METAL LAYERS WITH IMPROVED ELECTROMIGRATION RESISTANCE

TECHNICAL FIELD

The present invention relates to a method of manufacturing a multi-metal layer semiconductor device exhibiting improved electromigration resistance. The invention has particular applicability in manufacturing high density multi-metal layer semiconductor devices with design features of 0.25 microns and under.

BACKGROUND ART

The escalating requirements for high densification and performance associated with ultra large scale integration semiconductor devices require design features of 0.25 microns and under, such as 0.18 microns, increased transistor and circuit speeds, high reliability and increased manufacturing throughput. The reduction of design features to 0.25 microns and under challenges the limitations of conventional interconnection technology, including conventional photolithographic, etching and deposition techniques.

Conventional methodology for forming patterned metal layers comprises a subtractive etching or etch back step as the primary metal patterning technique. Such a method involves the formation of a first dielectric layer on a semiconductor substrate, typically monocrystalline silicon, with conductive contacts formed therein for electrical connection with an active region on the semiconductor substrate, such as a source/drain region. A metal layer, such as aluminum or an aluminum alloy, is deposited on the first dielectric layer, and a photoresist mask is formed on the metal layer having a pattern corresponding to a desired conductive pattern. The metal layer is then etched through the photoresist mask to form the conductive pattern comprising metal features separated by gaps, such as a plurality of metal lines with interwiring spacings therebetween. A dielectric layer is then applied to the resulting conductive pattern to fill in the gaps and the surface is planarized, as by conventional etching or chemical-mechanical polishing (CMP) planarization techniques.

As shown in FIGS. 1 and 2, conventional practices comprise depositing metal layer 11 on dielectric layer 10 which is typically formed on a semiconductor substrate containing an active region with transistors (not shown) After photolithography, etching is then conducted to form a patterned metal layer comprising metal features 11a, 11b, 11c and 11d with gaps therebetween. A dielectric material 12, such as spin on glass (SOG), is typically deposited to fill in the gaps between the metal features, and baked at a temperature of about 300° C. to about 450° C., for a period of time up to about two hours, depending upon the particular SOG material employed, to enhance the dielectric properties of SOG. A layer of silicon dioxide is deposited by plasma enhanced chemical vapor deposition (PECVD) to cap the SOG layer and is subsequently planarized, as by CMP, before the next level of via and metal wiring is attempted.

As feature sizes, e.g., metal lines and interwiring spacings, shrink to 0.25 microns and below, such as 0.18 microns, it becomes increasingly difficult to satisfactorily fill in the interwiring spacings voidlessly and obtain adequate step coverage. It also becomes increasingly difficult to form a reliable interconnection structure. A through-hole for a via is typically formed in a dielectric layer to expose an underlying metal feature, wherein the metal feature serves as a landing pad occupying the entire bottom of the through-hole. Upon filling the through-hole with conductive material, such as a metal plug to form a conductive via, the entire bottom surface of the conductive via is in direct contact with the metal feature. Such a conventional technique is illustrated in FIG. 3, wherein metal feature 30 of a first patterned metal layer is formed on first dielectric layer 31 and exposed by through-hole 32 formed in second dielectric layer 33. In accordance with conventional practices, through-hole 32 is formed so that metal feature 30 encloses the entire bottom opening, thereby serving as a landing pad for metal plug 34 which fills through-hole 32 to form conductive via 35. Thus, the entire bottom surface of conductive via 35 is in direct contact with metal feature 30. Conductive via 35 electrically connects metal feature 30 and metal feature 36 which is part of a second patterned metal layer. As shown in FIGS. 2 and 3, the side edges of a metal feature or conductive line,. e.g., 30A, 30B, and 36A, and 36B, taper somewhat as a result of etching.

The reduction of design features to the range of 0.25 microns and under results in extremely high density. The conventional practice of forming a landing pad completely enclosing the bottom surface of a conductive via utilizes a significant amount of precious real estate on a semiconductor chip which is antithetic to escalating high density requirements. In addition, it is extremely difficult to voidlessly fill through-holes having such reduced dimensions because of the extremely high aspect ratio, i.e., height of the through-hole with respect to diameter of the through-hole. Electrically, this leads to a via with an unacceptably high resistance. Accordingly, conventional remedial techniques comprise purposely widening the diameter of the through-hole to decrease the aspect ratio. As a result, misalignment occurs wherein the bottom surface of the conductive via is not completely enclosed by the underlying metal feature. This type of via is called a "borderless via", which also conserves chip real estate.

The formation of borderless vias, however, creates new problems. For example, as a result of misalignment, the SOG gap filling layer is penetrated by etching when forming a through-hole, due to the low density and poor stability of SOG. As a result of such penetration, moisture is absorbed during cleaning after forming a through-hole, thereby increasing the resistance of the via. Moreover, spiking can occur, i.e., unintended penetration of the metal plug to any active layer below the metal feature, causing an electrical short.

The use of a high density dielectric material, such as a high density plasma (HDP) oxide, appears promising as a substitute for SOG. HDP oxide is typically deposited by high density plasma chemical vapor deposition (HDP-CVD). See, for example, Liu et al., "Integrated HDP Technology for Sub-0.25 Micron Gap Fill", pp. 618–619; Bothra et al., "INTEGRATION OF 0.25 μm THREE AND FIVE LEVEL INTERCONNECT SYSTEM FOR HIGH PERFORMANCE ASIC.", pp. 43–48; Wang et al., "Process Window Characterization of ULTIMA HDP-CVD™ USG Film", pp. 405–408; Saikawa et al., "High Density Plasma CVD for 0.3 μm Device Application", pp. 69–75; Nguyen et al., "CHARACTERIZATION OF HIGH DENSITY PLASMA DEPOSITED SILICON OXIDE DIELECTRIC FOR 0.25 MICRON ULSI", pp. 69–74; all of which papers were presented at the Jun. 10–12, 1997 VMIC Conference, 1997 ISMIC.

HDP oxide advantageously exhibits superior gap filling properties and high stability vis-a-vis SOG and conventional PECVD oxides and, thus, easily fills gaps in a patterned metal layer with a 0.25 micron design rule. HDP oxide also exhibits superior qualities vis-á-vis SOG. For example, HDP oxide is denser and exhibits greater chemical stability and etch resistance than SOG. Accordingly, the use of HDP oxide appears promising for gap filling, particularly in manufacturing high density semiconductor devices with interconnection patterns having misaligned, i.e., borderless vias.

However, it was found that semiconductor devices having patterned metal layers gap filled with HDP oxide exhibit less electromigration resistance than those gap filled with SOG. Accordingly, there exists a need for methodology enabling the use of HDP oxide for gap filling patterned metal layers, particularly gaps consistent with a 0.25 micron design rule and under, without an attendant decrease in electromigration resistance.

DISCLOSURE OF THE INVENTION

An object of the present invention is a method of manufacturing a high density multi-metal layer semiconductor device having an interconnection structure, comprising HDP oxide for gap fill, with improved electromigration resistance.

Another object of the present invention is a method of manufacturing a high density multi-metal layer semiconductor device with design features of 0.25 microns and under, borderless vias and improved electromigration resistance.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a multi-level semiconductor device, which method comprises: forming a first dielectric layer on a semiconductor substrate; forming a first patterned metal layer having gaps therein on the first dielectric layer; depositing a high density plasma oxide to fill the gaps by high density plasma chemical vapor deposition; performing a first heat treatment at a first temperature for a first period of time to substantially increase the grain size of the first patterned metal layer, thereby increasing the electromigration resistance of the first patterned metal layer; and performing a second heat treatment at a second temperature lower than the first temperature, for a second period of time shorter than the first period of time.

Another aspect of the present invention is a method of manufacturing a semiconductor device, which method comprises: forming a first dielectric layer on a semiconductor substrate; forming a first patterned metal layer having gaps therein on the first dielectric layer; depositing a high density plasma oxide to fill the gaps by high density plasma chemical vapor deposition; and performing a heat treatment at a temperature of about 350° C. to about 450° C. for about 30 minutes to about 2 hours in an inert atmosphere to substantially increase the grain size of the first patterned metal layer, thereby increasing the electromigration resistance of the first patterned metal layer.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

Figure 1:
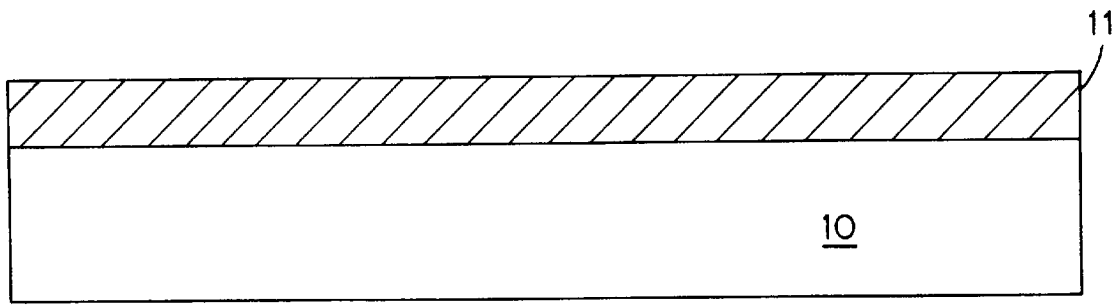
FIGS. 1 and 2 schematically illustrate conventional methodology in gap filling a patterned metal layer.
Figure 2:
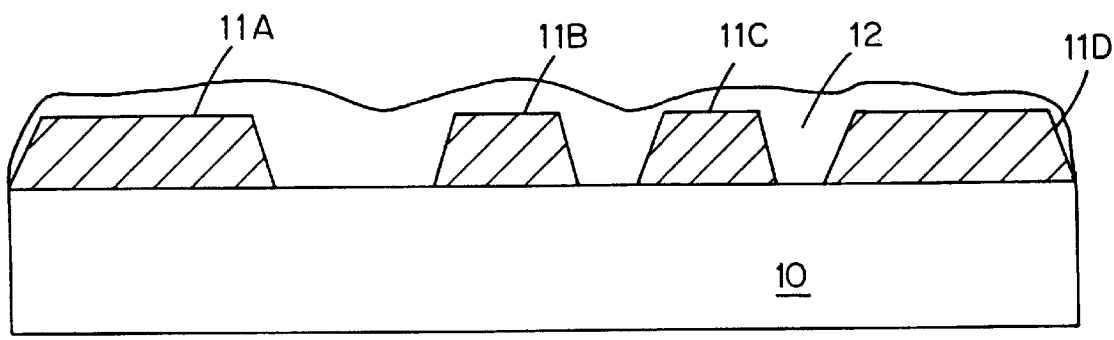
Figure 3:
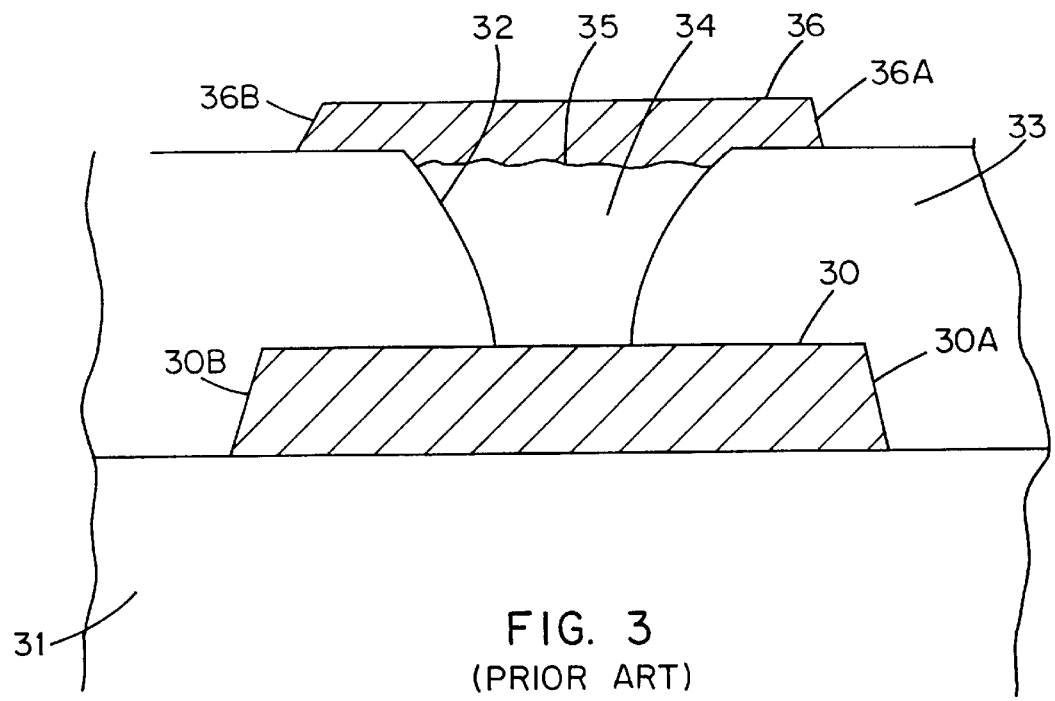
FIG. 3 schematically illustrates a conventional metal plug via interconnection.

The present invention enables the use of borderless vias in forming high density multi-metal layer semiconductor devices having design features of 0.25 microns and under, employing HDP oxide to fill gaps in patterned metal layers, without sacrificing electromigration resistance of the patterned metal layers. A limitation on the lifetime and reliability of conventional semiconductor devices attributed to metal interconnections is due to electromigration. The phenomenon of electromigration involves the flow of electrons causing the migration of metal atoms, thereby generating voids and hillocks. The formation of voids creates an opening in a metal layer or line, thereby decreasing performance. The formation of voids generates areas of increased resistance which undesirably reduce the speed at which a semiconductor device can function. Thus, the electromigration phenomenon constitutes a limitation on the lifetime of a metal line as well as the performance of the semiconductor device. In the extreme case, the device becomes nonfunctional due to a discontinuity in the metal line generated by a sufficiently large void.

Electromigration in a metal interconnection line can be characterized by the movement of ions induced by a high electrical current density. As the feature size of semiconductor devices decreases, the current density consequently increases and, hence, electromigration-induced metallization failures increase. Current metallization failures resulting from electromigration are acutely problematic.

Semiconductor devices comprising conductive patterns having design features of 0.25 microns and under are characterized by a high electrical current density and, consequently, increased metallization electromigration failures. The requirement for a long electromigration lifetime is of critical importance for an interconnection system. The increased susceptibility to electromigration as design features shrink is exacerbated by a reduction in electromigration resistance upon attempting to replace SOG with HDP oxide to gap fill patterned metal layers.

Upon experimentation and investigation of SOG methodology vis-á-vis HDP oxide methodology, i.e., HDP-CVD, and examination of electromigration failures, it was observed that patterned metal layers gap filled with SOG exhibited grain sizes larger than the grain sizes of patterned metal layers gap filled by HDP oxides. Electromigration resistance decreases as the grain size of a metal layer decreases. Accordingly, it is advantageous to form patterned metal layers exhibiting a large grain size. It was further observed that when depositing SOG, a baking treatment is normally performed for densification. Such an SOG baking treatment is typically conducted at a temperature of about 350° C. to about 450° C. for a period of time of up to about two hours. Upon further experimentation and investigation, it was found that the SOG baking treatment substantially increases the grain size of the gap filled patterned metal layers.

Other conventional heat treatments performed during semiconductor manufacturing were investigated, including a heat treatment known as "alloying" or "annealing" which is typically conducted after formation of all patterned metal layers at a temperature of about 350° C. to about 400° C. for a period of time up to about one hour in an atmosphere of nitrogen and hydrogen in amounts of about 10% by volume. The "annealing" step is performed to remove radiation damage, drive out moisture and neutralize trapped charges. Upon experimentation and investigation, it was found that the conventional "annealing" step was insufficient to cause any significant grain growth of patterned metal layers. Since HDP-CVD does not require a relatively severe heat treatment for densification, as does SOG, and the conventional "annealing" step is insufficient to increase the grain size of the patterned metal layers, it was concluded that a patterned metal layer gap filled with SOG exhibits greater electromigration resistance than a patterned metal layer gap filled with a HDP oxide, because of the relatively severe densification baking performed after SOG deposition which induces grain growth of the gap filled patterned metal layer.

In accordance with the present invention, patterned metal layers of a multi-metal layer semiconductor device are gap filled employing HDP oxide deposited by HDP-CVD. However, a heat treatment step is performed under conditions paralleling a conventional SOG baking treatment of about 350° C. to about 450° C. for about 45 minutes to about 2 hours, to substantially increase the grain size of the gap filled patterned metal layers for improved electromigration resistance. The heat treatment for substantially increasing the grain size of the patterned metal layers in accordance with the present invention is desirably performed in an inert atmosphere, such as an atmosphere of nitrogen, argon, helium, or mixtures thereof. Such a heat treatment, which is more severe in terms of temperature and time than the conventional "annealing" step, was found to increase the grain size of a patterned metal layer by about 20% to about 80%, with an attendant improvement in electromigration resistance.

In an embodiment of the present invention, heat treatment for substantially increasing the grain size of the patterned metal layers is performed after each patterned metal layer is gap filled with an HDP oxide. Another embodiment of the present invention comprises heat treating to substantially increase the grain size of the patterned metal layers after all the metal layers have been gap filled, or after the final topside passivating coating, typically silicon nitride, is applied.

In another embodiment of the present invention, the heat treatment to substantially increase the metal grain size is performed after gap filling all patterned metal layers, prior to the conventional "alloying" step. In an aspect of this embodiment, a first heat treatment is performed to substantially increase the grain size of the patterned metal layers at a first temperature and for a first period of time, followed by a second conventional "alloying" heat treatment at a second temperature, lower than the first temperature, for a second period of time, shorter than the first period of time. The first heat treatment for substantially increasing metal grain size is conducted at a temperature of about 350° C. to about 450° C. for about 45 minutes to about 2 hours in an inert atmosphere; while the second "alloying" heat treatment is performed at a temperature of about 350° C. to about 450° C. for about 30 minutes to about 1 hour in an atmosphere containing nitrogen and hydrogen in an amount up to about 10% by volume, e.g., about 5% to about 15%. The first heat treatment advantageously increases the metal grain size by about 20% to about 80%. In another aspect of this embodiment, the first heat treatment and the second "alloying" heat treatment are conducted in a single furnace for increased efficiency. After the first heat treatment is conducted, the temperature in the furnace is lowered and the atmosphere changed to conduct the second, "alloying" heat treatment. The temperature and atmosphere change is done without pulling the wafers from the furnace, thereby saving valuable time by omitting ramp and stabilization steps typical in a furnace process. By merging the first and second heat treatments, time saving is realized over the separate heat treatment cycles, thereby significantly improving efficiency.

The present invention enables efficient manufacturing of high density semiconductor devices having a plurality, e.g., five HDP-oxide gap filled patterned metal layers, and an interconnection system with design features of 0.25 microns and under, borderless vias, and improved electromigration resistance. In accordance with the present invention, such vias can be filled with suitable metal, such as tungsten, by conventional techniques, such as various forms of CVD. In an embodiment of the present invention, a via opening is filled with a composite plug comprising a first adhesion layer, such as titanium, titaniumtungsten, titanium nitride or titanium-titanium nitride, and a tungsten layer thereon. The patterned metal layers formed in accordance with the present invention typically comprise aluminum or an aluminum alloy. Embodiments of the present invention include forming a composite patterned metal layer comprising an initial titanium layer, an intermediate aluminum or aluminum alloy layer, and an upper anti-reflective coating, such as titanium-titanium nitride. The above description is for a specific embodiment of this invention. In general, other adhesion, plug-fill, and interconnect metal materials may be employed.

Figure 4:
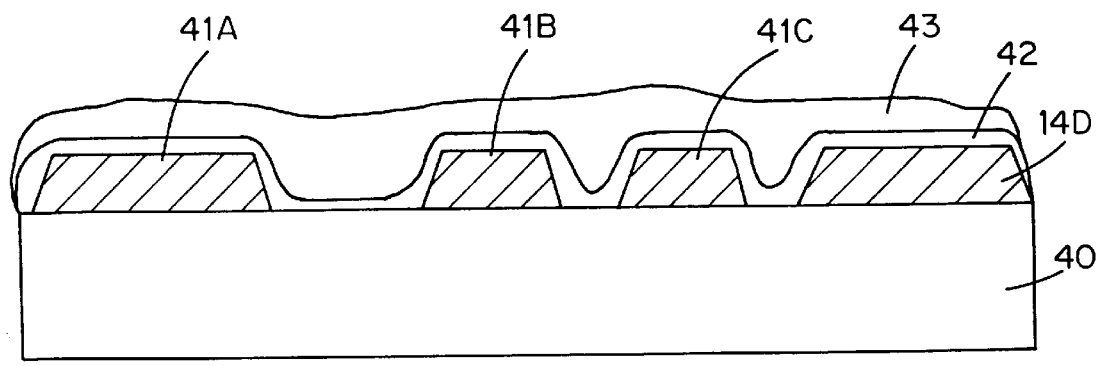
FIG. 4 schematically illustrates an embodiment of the present invention employing HDP oxide to gap fill a patterned metal layer.

In accordance with the present invention, gaps between metal features, e.g., metal lines, of a deposited metal layer are filled by depositing an HDP oxide by HDP-CVD. The resulting HDP oxide has excellent gap fill properties. In an embodiment of the present invention, a layer of oxide derived from tetraethyl orthosilicate (TEOS) is deposited after HPD-CVD and planarized by CMP. This layer of TEOS oxide may be omitted by increasing the A-- 15 thickness of the HDP oxide, albeit at an increased cost since TEOS oxide is less expensive than HDP oxide. Adverting to FIG. 4, a patterned metal layer comprising metal features 41*a*, 41*b*, 41*c* and 41*d* is formed on dielectric layer 40. Gaps between the metal features are filled with a layer of HDP oxide 42. An oxide layer derived from TEOS 43 is then deposited on top and planarization can then be effected in a conventional manner using CMP.

Figure 5:
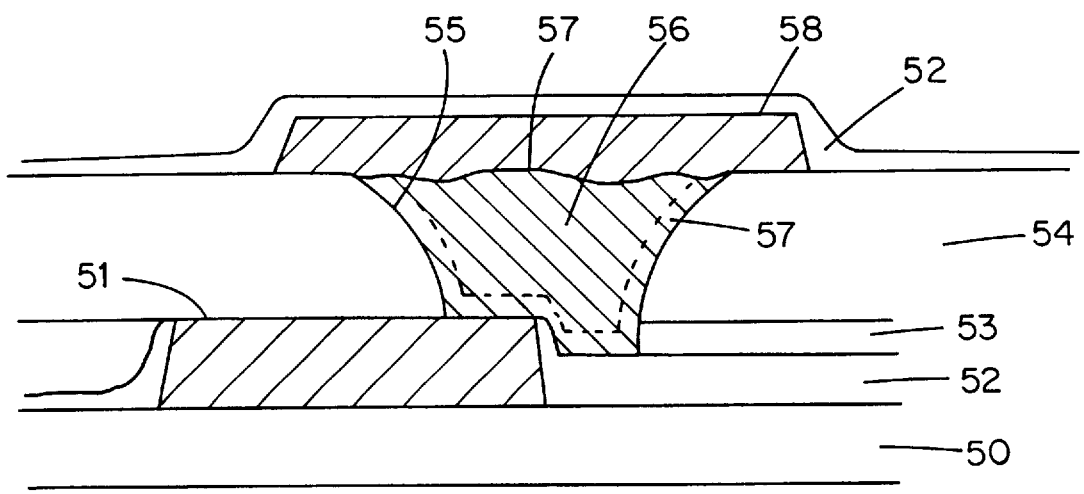
FIG. 5 illustrates a borderless via formed according to the present invention.

The use of an HDP oxide to gap fill metal lines enables reliable formation of borderless vias by allowing for larger and low-resistance vias that can fall off underlying metal due to misalignment to conserve chip real estate with increased aspect ratio of through-holes, thereby facilitating voidlessly filling the through-holes with metal to form a conductive via interconnecting patterned metal layers on different levels. Adverting to FIG. 5, metal feature 51 of a patterned metal layer is formed on dielectric layer 50. Gaps between metal features are filled with an HDP oxide 52. An oxide derived from TEOS 53 is then deposited and CMP performed. Second dielectric layer 54 is then deposited and a through-hole 55 formed therein for a borderless via. The bottom of through-hole 55 is exposed to a portion of metal feature 51 and to HDP oxide 52 which, due to its stability and high etch resistance, prevents etching to or through first dielectric layer 50. Through-hole 55 is then filled with a tungsten plug 56. Optionally, an adhesion promoting layer 57 is initially deposited prior to plug fill. Adhesion promoting layer 57 can comprise a refractory metal typically employed for improving the adhesion of tungsten to the oxide dielectric and underlying aluminum feature. Such a refractory material can be titanium, titanium nitride, titanium-tungsten or titanium-titanium nitride. After formation of conductive via 57, a second patterned metal layer is formed on second dielectric layer 54 and comprises metal feature 58 electrically connected to metal feature 51 through conductive via 57. The process is then repeated by gap filling the second patterned metal layer using an HDP oxide until the desired number of patterned metal layers are formed and gap filled, e.g., five metal layers. In this embodiment of the present invention, the number of patterned layers required can vary depending upon the design of a given semiconductor circuit.

The various dielectric layers employed in the practice of the present invention can be any of those conventionally employed in forming a semiconductor device, e.g., silicon dioxide deposited by conventional methodology, including various forms of CVD. The optional adhesion promoter layer 57 is typically deposited by sputtering.

The present invention is applicable to the production of various types of semiconductive devices, particularly high density multi-metal patterned layers with submicron features, particularly submicron features of 0.25 microns and below, exhibiting high speed characteristics and improved reliability. The present invention enables the advantageous use of HDP oxides to gap fill patterned metal layers without an attendant decrease in electromigration resistance. The present invention is cost effective and can easily be integrated into conventional processing and equipment.

In carrying out the embodiments of the present invention, the metal layers can be formed of any metal typically employed in manufacturing semiconductor devices, such as aluminum, aluminum alloys, copper, copper alloys, gold, gold alloys, silver, silver alloys, refractory metals, refractory metal alloys, and refractory metal compounds. The metal layers of the present invention can be formed by any technique conventionally employed in the manufacture of semiconductor devices. For example, the metal layers can be formed by conventional metallization techniques, such as various types of CVD and sputtering processes, including low pressure chemical vapor deposition (LPCVD), collimated physical vapor deposition (COLPVD), and ionized-metal physical vapor deposition (IMPVD). Normally, when high melting metal point metals such as tungsten are deposited, CVD techniques are employed. Low melting point metals, such as aluminum and aluminum-base alloys, including aluminum-copper alloys, can also be deposited by melting, sputtering, or physical vapor deposition (PVD).

In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail in order not to unnecessarily obscure the present invention.

Only the preferred embodiment of the invention and an example of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a multi-level semiconductor device, which method comprises:
    forming a first dielectric layer on a semiconductor substrate;
    forming a first patterned metal layer having gaps therein on the first dielectric layer;
    depositing a high density plasma oxide to fill the gaps by high density plasma chemical vapor deposition;
    performing a first heat treatment at a first temperature for a first period of time to substantially increase the grain size of the first patterned metal layer, thereby increasing the electromigration resistance of the first patterned metal layer; and
    performing a second heat treatment at a second temperature lower than the first temperature, for a second period of time shorter than the first period of time.

2. The method according to claim 1, comprising:
    performing the first heat treatment in an inert atmosphere; and
    performing the second heat treatment in an atmosphere comprising nitrogen and hydrogen in an amount of about 5% to about 15 volume % of hydrogen.

3. The method according to claim 2, wherein the inert atmosphere comprises nitrogen, argon or helium.

4. The method according to claim 1, comprising:
    performing the first heat treatment to increase the grain size of a first patterned metal layer about 20% to about 80%.

5. The method according to claim 4, comprising:
    performing the first heat treatment at a first temperature of about 350° C. to about 450° C. for a first period of time of about 45 minutes to about 2 hours; and
    performing the second heat treatment at a second temperature of about 300° C. to about 400° C. for a second period of time of about 30 minutes to about 1 hour.

6. The method according to claim 2, comprising:
    performing the first and second heat treatments consecutively in a single furnace.

7. The method according to claim 1, wherein the patterned metal layer comprises aluminum or an aluminum alloy.

8. The method according to claim 1, comprising forming the first patterned metal layer by:
    depositing a metal layer on the first dielectric layer; and
    etching the deposited metal layer to form the first patterned metal layer having gaps therein.

9. The method according to claim 1, comprising:
    depositing a second dielectric layer on the first patterned metal layer;
    forming a through-hole in the second dielectric layer exposing a portion of the first patterned metal layer and a portion of dielectric material;
    filling the through-hole with a conductive material to form a borderless conductive via; and
    forming a second patterned metal layer, having gaps therein, on the second dielectric layer and electrically connected to the first patterned metal layer through the borderless conductive via.

10. The method according to claim 9, wherein a portion of the entire dielectric material exposed by the through-hole is the high density plasma oxide.

11. The method according to claim 9, wherein the conductive material is a composite comprising a first conductive layer of a refractory material which acts as an adhesion promoter for a second conductive layer.

12. The method according to claim 11, wherein the refractory material comprises titanium, titanium nitride, titanium-tungsten, or titanium-titanium nitride, and the second conductive layer comprises tungsten.

13. The method according to claim 9, comprising sequentially forming a plurality of dielectric and patterned metal layers each containing gaps therein on the second patterned metal layer;

depositing a high density plasma oxide by high density plasma enhanced CVD to fill the gaps of each patterned metal layer; and performing the first and second heat treatments after gap filling all patterned metal layers.

14. The method according to claim 13, comprising:

forming five patterned metal layers each containing gaps therein;

forming a topside passivating dielectric layer; and performing the first and second heat treatments after forming the topside passivating dielectric layer.

15. The method according to claim 14, wherein the topside passivating dielectric layer comprises silicon nitride.

16. The method according to claim 13, comprising performing the first heat treatment to increase the grain size of each patterned metal layer by about 20% to about 80%.

17. The method according to claim 1, wherein the high density plasma oxide is deposited as a gap fill layer, which method further comprises:

depositing an oxide layer derived from tetraethyl orthosilicate on the high density plasma oxide layer; and planarizing by chemical-mechanical polishing.

18. A method of manufacturing a semiconductor device, which method comprises:

forming a first dielectric layer on a semiconductor substrate containing active devices;

forming a first patterned metal layer having gaps therein on the first dielectric layer;

depositing a high density plasma oxide to fill the gaps by high density plasma enhanced chemical vapor deposition; and performing a heat treatment at a temperature of about 350° C. to about 450° C. for about 30 minutes to about 2 hours in an inert atmosphere to substantially increase the grain size of the first patterned metal layer thereby increasing the electromigration resistance of the first patterned metal layer.

19. The method according to claim 18, wherein the inert gas comprises nitrogen, argon or helium.

20. The method according to claim 18, comprising heat treating under conditions sufficient to increase the grain size of the first patterned metal layer by about 20% to about 80%.

21. The method according to claim 18, comprising sequentially forming a plurality of dielectric and patterned metal layers, each metal layer containing gaps therein, on the first patterned metal layer; and depositing a high density plasma oxide by high density plasma chemical vapor deposition to fill the gaps of each patterned metal layer.

22. The method according to claim 21, wherein the heat treatment is performed after each patterned metal layer is gap filled with a high density plasma oxide.

23. The method according to claim 21, comprising performing the heat treatment after gap filling all patterned metal layers.

24. The method according to claim 21, comprising forming five metal layers.

25. The method according to claim 2, comprising performing the first and second heat treatments as separate process steps.

* * * * *